US010644733B2

(12) United States Patent
Ramesh et al.

(10) Patent No.: US 10,644,733 B2
(45) Date of Patent: *May 5, 2020

(54) METHOD AND SYSTEM FOR CREST FACTOR REDUCTION (71) Applicant: Maxlinear, Inc., Carlsbad, CA (US)

(72) Inventors: Sridhar Ramesh, Carlsbad, CA (US); Timothy Gallagher, Carlsbad, CA (US); Shantha Murthy Prem Swaroop, Carlsbad, CA (US); Ali Shahed hagh ghadam, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/137,268

(22) Filed: Sep. 20, 2018

(65) Prior Publication Data
US 2019/0028128 A1 Jan. 24, 2019

Related U.S. Application Data (63) Continuation of application No. 15/646,773, filed on Jul. 11, 2017, now Pat. No. 10,084,494, which is a
(Continued)

(51) Int. Cl.
H04B 1/04 (2006.01)
H03G 3/30 (2006.01)
(Continued)

(52) U.S. Cl.
CPC ............. *H04B 1/0475* (2013.01); *H03F 1/02* (2013.01); *H03F 1/3241* (2013.01);
(Continued)

(58) Field of Classification Search
CPC .......... H04B 1/02; H04B 1/04; H04B 1/0475; H04B 1/62; H04B 1/64; H04B 2001/0408;
(Continued)

(56) References Cited

U.S. PATENT DOCUMENTS

7,286,605 B2 10/2007 Laaser
7,741,906 B1 6/2010 Summerfield
(Continued)

*Primary Examiner* — Siu M Lee
(74) *Attorney, Agent, or Firm* — McAndrews, Held & Malloy, Ltd.

(57) ABSTRACT

Methods and systems for crest factor reduction may comprise generating an original waveform, generating a distortion signal by reducing a crest factor of the original waveform, generating an error signal by subtracting out the original waveform from the distortion signal, and generating a conditioned waveform by adding the error signal to the original waveform. The crest factor of the original waveform may be reduced based on spectral mask requirements. The crest factor of the original waveform may be reduced using a limiter. The power amplifier may comprise a programmable gain amplifier (PGA). The distortion signal may be generated based on a PGA model and/or a predistortion model. A signal from an output of the PA may be fed back to the PGA model. The PGA model may be dynamically configured. The crest factor of the original waveform may be reduced in an analog domain and/or a digital domain.

20 Claims, 8 Drawing Sheets

Related U.S. Application Data continuation of application No. 15/140,599, filed on Apr. 28, 2016, now Pat. No. 9,705,541, which is a continuation of application No. 14/589,801, filed on Jan. 5, 2015, now Pat. No. 9,331,725.

(60) Provisional application No. 61/923,338, filed on Jan. 3, 2014.

(51) Int. Cl.
| | | |
|---|---|---|
| *H03F 1/32* | (2006.01) | |
| *H03F 3/195* | (2006.01) | |
| *H03F 3/24* | (2006.01) | |
| *H03F 1/02* | (2006.01) | |
| *H03F 3/213* | (2006.01) | |

(52) U.S. Cl.
CPC ........... *H03F 1/3247* (2013.01); *H03F 3/195* (2013.01); *H03F 3/213* (2013.01); *H03F 3/24* (2013.01); *H03G 3/3042* (2013.01); *H03F 2200/451* (2013.01); *H03F 2201/3215* (2013.01); *H04B 2001/045* (2013.01); *H04B 2001/0425* (2013.01)

(58) Field of Classification Search
CPC .... H04B 2001/0416; H04B 2001/0425; H04B 2001/0433; H04B 2001/0441; H04B 2001/045; H04L 27/366; H04L 27/367; H04L 27/368; H04L 27/2614; H04L 27/2623; H04L 27/2624; H04F 1/32; H04F 1/3241; H04F 1/3247; H04F 2201/32; H04F 2201/3221; H04F 2201/3224; H04F 2201/3227; H04F 2201/3231; H04F 2201/3233; H04F 2201/3236

USPC ......................................... 375/295, 296, 297

See application file for complete search history.

(56) References Cited

U.S. PATENT DOCUMENTS

| | | |
|---|---|---|
| 8,503,950 B1 | 8/2013 | Dick |
| 8,724,721 B2 | 5/2014 | Soler Garrido |
| 9,331,725 B2 * | 5/2016 | Sridhar ................ H03G 3/3042 |
| 9,705,541 B2 * | 7/2017 | Sridhar ................ H03G 3/3042 |
| 10,084,494 B2 * | 9/2018 | Sridhar ................ H03G 3/3042 |
| 2002/0061738 A1 | 5/2002 | Simmons |
| 2004/0076247 A1 * | 4/2004 | Barak ................ H04L 27/2623 375/350 |
| 2010/0069023 A1 * | 3/2010 | Coan .................... H03F 1/3241 455/114.3 |
| 2011/0228872 A1 * | 9/2011 | Soler Garrido ..... H04L 27/2623 375/295 |
| 2012/0170624 A1 | 7/2012 | Rozenblit et al. |
| 2012/0270511 A1 * | 10/2012 | Dakshinamurthy ........................ H03G 3/3042 455/115.1 |
| 2013/0114762 A1 | 5/2013 | Azadet et al. |
| 2013/0163512 A1 | 6/2013 | Rexberg et al. |

* cited by examiner

METHOD AND SYSTEM FOR CREST FACTOR REDUCTION

CROSS-REFERENCE TO RELATED APPLICATIONS/INCORPORATION BY REFERENCE

This application is a continuation of application Ser. No. 15/646,773 filed on Jul. 11, 2017, which is a continuation of application Ser. No. 15/140,599 filed on Apr. 28, 2016, now U.S. Pat. No. 9,705,541, which is a continuation of application Ser. No. 14/589,801 filed on Jan. 5, 2015, now U.S. Pat. No. 9,331,725, which makes reference to and claims priority to U.S. Provisional Application Ser. No. 61/923,338 filed on Jan. 3, 2014, each of which is incorporated herein by reference in its entirety.

FIELD

Certain embodiments of the disclosure relate to communication. More specifically, certain embodiments of the disclosure relate to a method and system for crest factor reduction.

BACKGROUND

Conventional methods of crest factor reduction can be inefficient and/or ineffective. Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method for crest factor reduction substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for crest factor reduction. Exemplary aspects may comprise generating an original waveform, generating a distortion signal by reducing a crest factor of the original waveform, generating an error signal by subtracting out the original waveform from the distortion signal, generating a conditioned waveform by adding the error signal to the original waveform, and amplifying the conditioned waveform. The crest factor of the original waveform may be reduced based on spectral mask requirements. The crest factor of the original waveform may be reduced using a limiter. The power amplifier may comprise a programmable gain amplifier (PGA). The distortion signal may be generated based on a PGA model and/or a predistortion model. A signal from an output of the PA may be fed back to the PGA model. The PGA model may be dynamically configured. The crest factor of the original waveform may be reduced in an analog domain and/or a digital domain. The error signal may be filtered utilizing a distortion shaping filter.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1A:
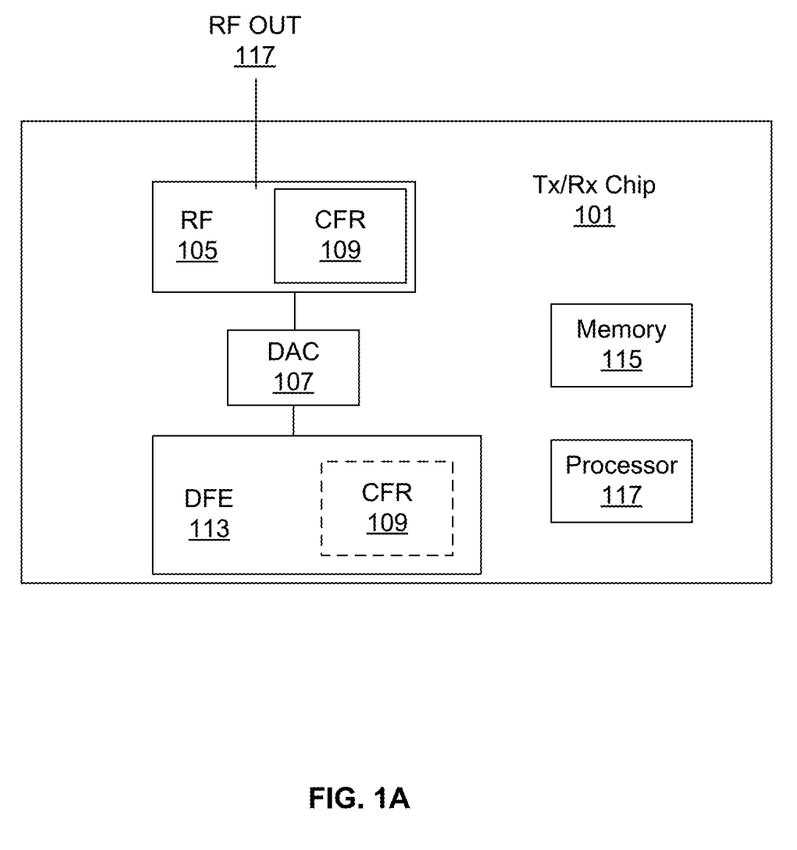
FIG. 1A is a diagram of an exemplary communication device with crest factor reduction, in accordance with an example embodiment of the disclosure.

FIG. 1A is a diagram of an exemplary communication device with crest factor reduction, in accordance with an example embodiment of the disclosure. Referring to FIG. 1A, there is shown a transmitter 101 chip comprising a radio frequency (RF) module 105, a digital to analog converter (DAC) 107, a digital front end (DFE) 113, a memory 115, and a processor 117. In an example scenario, the transmitter chip comprises a single CMOS chip. In another example scenario, the transmitter chip comprises a plurality of chips.

The transmitter 101 may be in a transceiver, for example, and may be utilized for transmitting and receiving RF signals carrying multiple channels of data desired and/or generated by a user or service provider. In an example scenario, the transmitter 101 may comprise a wireless communication device. While the example embodiment shown in FIG. 1A shows crest factor reduction in an RF transmission scenario, it may apply to any case where crest factor may impact amplifier performance.

The RF module 105 may comprise one or more RF receive (Rx) and transmit (Tx) paths for receiving and transmitting RF signals. The RF module 105 may comprise impedance matching elements, LNAs, power amplifiers, variable gain amplifiers, and filters, for example. The RF module 105 may thus be operable to transmit, receive, amplify, and filter RF signals before communicating them to an antenna for transmission. In an example scenario, the RF module 105 may comprise crest factor reduction module 109, which may be operable to reduce the crest factor, i.e., the peak magnitude to average value, of a signal to be communicated as RF OUT 117. This may be achieved by limiting the magnitude of a signal, such as with a limiter, for example, which may distort the signal, which may be compensated for by applying a distortion signal to the reduced-crest-factor signal. The limiting function may be of "hard-limiting" or "soft-limiting" nature. Soft-limiting is by means of a non-linear compressing function, while the output in hard-limiting is linear until it reaches the maximum and is clamped at that value. Soft-limiting and hard-limiting are illustrated by the insets in FIG. 2B.

The application of the compensating distortion is in effect filtering the distortion generated by limiting the signal.

The DAC 107 may comprise a wideband and/or time-interleaved ADC and may be operable to convert digital signals received from the DFE 113 to analog signals. In an example scenario, the DAC 107 may comprise a direct-sampled ADC and may comprise two parallel ADC paths, each sampling 180 degrees out of phase with each other, resulting in a total sampling rate that is double that of each individual path. For example, if each ADC path samples at 2.5 GHz, the resulting sampling rate for the signal communicated to the digital front end 113 is 5.0 GHz.

The digital front end 113 may comprise circuitry for receiving a data stream from the processor 117 and for communicating samples to the DAC 107. The processor 117 may comprise a general purpose processor, such as a reduced instruction set computing (RISC) processor, for example, that may be operable to control the functions of the transmitter 101. For example, the processor 117 may configure the switches 109 in an open or closed position. Additionally, the processor 117 may demodulate baseband signals received from the digital front end 113.

The memory 115 may comprise a programmable memory module that may be operable to store software and data, for example, for the operation of the transmitter 101. Furthermore, the memory 115 may store distortion filtering settings for the crest factor reduction module 109.

Various aspects of this disclosure may be applied to improve power amplifier performance while OFDM or multi-channel signals are being transmitted. This may include crest factor reduction to suppress high peaks, avoid catastrophic clipping in the power amplifier PA, and shape spectral regrowth away from problematic frequencies.

Figure 1B:
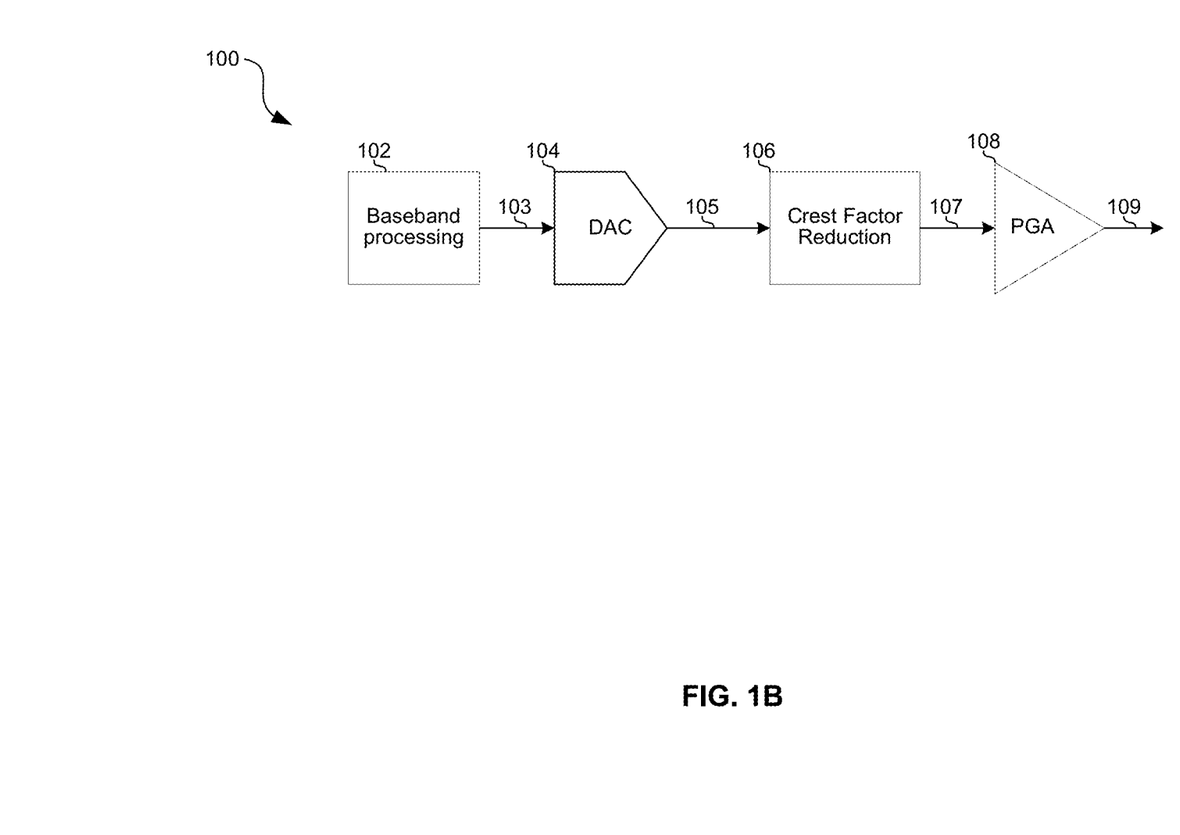
FIG. 1B is a block diagram of an example transmitter operable to perform crest factor reduction in accordance with aspects of the disclosure.

FIG. 1B depicts a block diagram of a transmitter operable to perform crest factor reduction in accordance with aspects of this disclosure. The transmitter 100 comprises baseband processing circuit 102, digital to analog converter 104, crest factor reduction (CFR) module 106, and a programmable gain power amplifier (PGA) 108. While the crest factor reduction circuit 102 is shown between the DAC 104 and the PGA 108, it may instead be implemented partially or wholly in the digital domain prior to the DAC 104, such as by being integrated in the baseband processing circuit 102.

The baseband processing circuit 102 may perform such functions as, for example, filtering, forward error correction encoding, bit-to-symbol mapping, digital upconversion, and/or the like, and may generate a signal 103. The signal 103 output by baseband processing circuit 102 may then be converted to an analog representation 105 by the DAC 104. The analog signal 105 may then be processed by CFR 106 to generate signal 107, with the goal of the processing being such that the crest factor of the signal 107 is less than the crest factor of the signal 105. The signal 107 may then be amplified by the PGA 108 for transmission onto the physical medium (e.g., wire, optical fiber, or air).

In an example scenario, the CFR module 106 may reduce the crest factor of the analog signal 105, which may be accomplished with a limiter, for example. This limiting of the received signal 105 may in turn generate in-band and/or out-of-band distortion, i.e., an error signal, which may be compensated by the CFR module 106 by subtracting out a compensating error signal generated by the CFR module 106.

The CFR module 106 may comprise a distortion shaping filter that may be configured to eliminate and/or reduce out-of-band distortion resulting from the reduction of the crest factor of the received signal. In addition, the compensating error signal may be generated in the CFR module 106 by considering at least three factors comprising the peak-to-average ratio (crest factor), the in-band distortion, and the out-of-band distortion. The factors may be determined by spectral mask requirements for the transmitter.

Figure 2A:
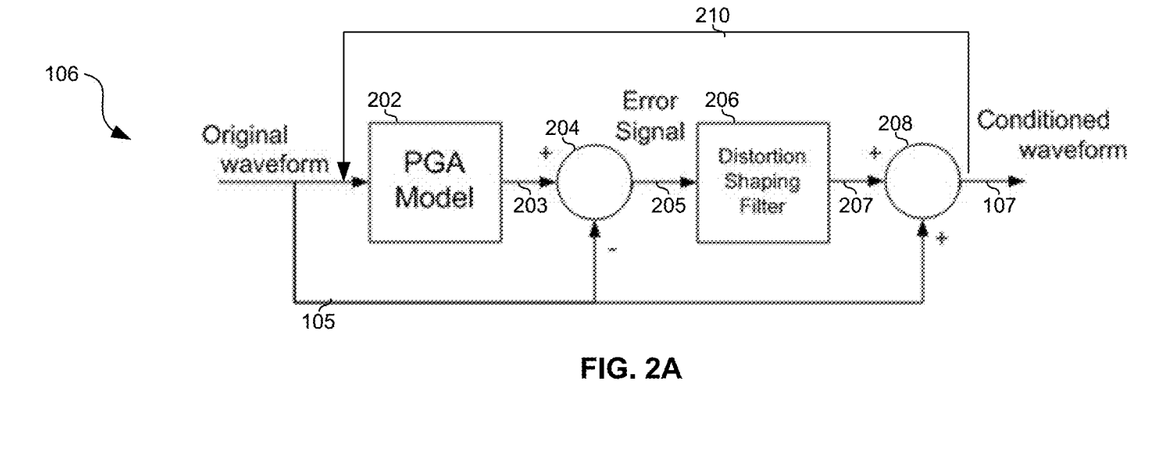
FIG. 2A is a block diagram of an example implementation of the crest factor reduction module of the transmitter of FIG. 1B.

FIG. 2A depicts a block diagram of an example implementation of the crest factor reduction module of the transmitter of FIG. 1B for example. The example implementation of CFR module 106 shown in FIG. 2A comprises a circuit 202 which is a model of the PGA 108, a combiner 204, a distortion shaping filter 206, and a combiner 208. The output 105 of the DAC (or the DFE, for example, if in the digital domain) may be input to the circuit 202 to generate a distortion signal 203 which models the signal that will be output by the PGA 108. The signal 105 may then be subtracted off of the distortion signal 203 by the combiner 204, resulting in the error signal 205 which represents the distortion introduced by the PGA model 202 (which, in turn, represents the distortion that will be introduced by the actual PGA 108).

The distortion shaping filter 206 may be operable to analyze the signal 205 to determine where spectral regrowth is arising due to the PGA model 202. Such regrowth could be in-band (i.e., within the frequency band allocated for communications by the transmitter 100), in an adjacent band (i.e., relatively close to the allocated frequency band), and/or at a harmonic of the frequency band allocated for communications by the transmitter 100 (e.g., much higher or lower in frequency than the adjacent bands). The distortion shaping filter 206 may then configure itself to shape the energy of the error signal 205 (i.e., the energy of the predicted distortion in the absence of circuit 206) such that when the resulting filtered error signal 207 is combined with the signal 105, the resulting signal, the conditioned waveform 107, has a lower crest factor than the signal 105. For example, the signal 207 may be 180° out of phase with the signal 105 such that cancellation occurs in combiner 208.

The CFR module 106 may operate at a slower rate than the DAC sample rate. For example, the distortion shaping filter 206 may update every Nth (an integer) group of M (an integer) samples of the signal 105 or, in an OFDM system, it may update at the OFDM-symbol rate. Because the CFR module 106 may operate below the DAC sampling frequency, the CFR module 106 may iterate (as indicated by line 210) on a particular sample or group of samples to refine the results.

It may be the case that the PA 108 is predicted to introduce a lot of distortion in one or more of three frequency regions (the three regions being in-band, adjacent bands, and harmonic bands) while introducing little or no distortion in other(s) of the regions. Accordingly, the filtering may trade off margin in one region (e.g., in-band) to gain margin in another (e.g., harmonic bands). The selected trade-off may change with each update of the filter 206 (e.g., the trade-off may be determined on a symbol-by-symbol basis).

Figure 2B:
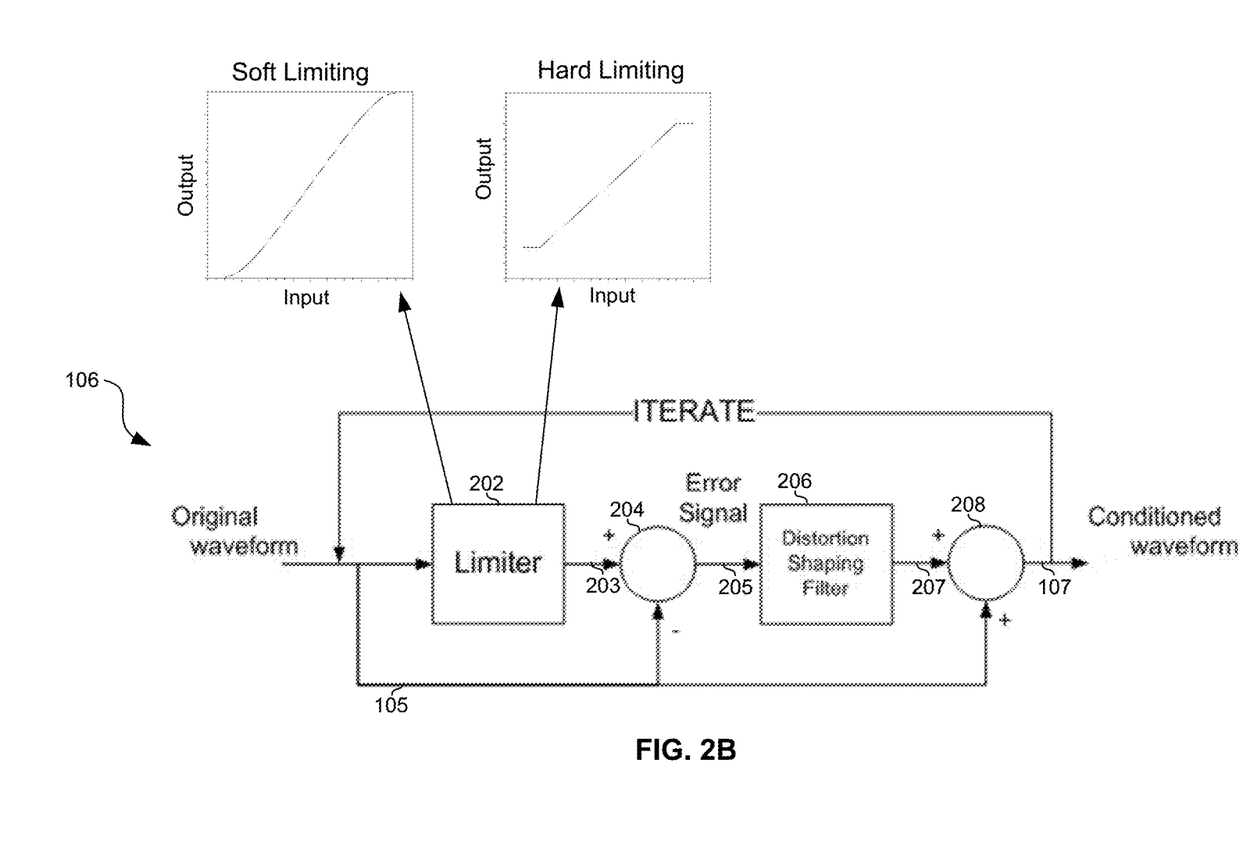
FIG. 2B is a block diagram of an example implementation of the crest factor reduction module of the transmitter of FIG. 1B.

FIG. 2B depicts a block diagram of an example implementation of the crest factor reduction module of the transmitter of FIG. 1B. FIG. 2B depicts a particular implementation where the PGA model 202 simply models the PGA 108 as clipping above a threshold (which may be programmable). The limiter 202 may therefore clip the output level such that the crest factor of the signal is reduced. The limiting function of the limiter 202 may be of hard-limiting type or soft-limiting type, as illustrated in the insets of FIG. 2B.

However, this clipping leads to distortion in the signal that may then be compensated for with the distortion shaping filter 206, similar to the process described with respect to FIG. 2A.

The distortion shaping filter 206 may be operable to analyze the signal 205 to determine where spectral regrowth is arising due to the clipping from the limiter 202. The distortion shaping filter 206 may then configure itself to shape the energy of the error signal 205 such that when the resulting filtered error signal 207 is combined with the signal 105, the resulting signal, the conditioned waveform 107, has a lower crest factor than the signal 105. For example, the signal 207 may be 180° out of phase with the signal 105 such that cancellation occurs in combiner 208. One benefit of the CFR module 106 of FIGS. 2A and 2B is that it is not necessary to determine the inverse model of the PGA 108.

Figure 3A:
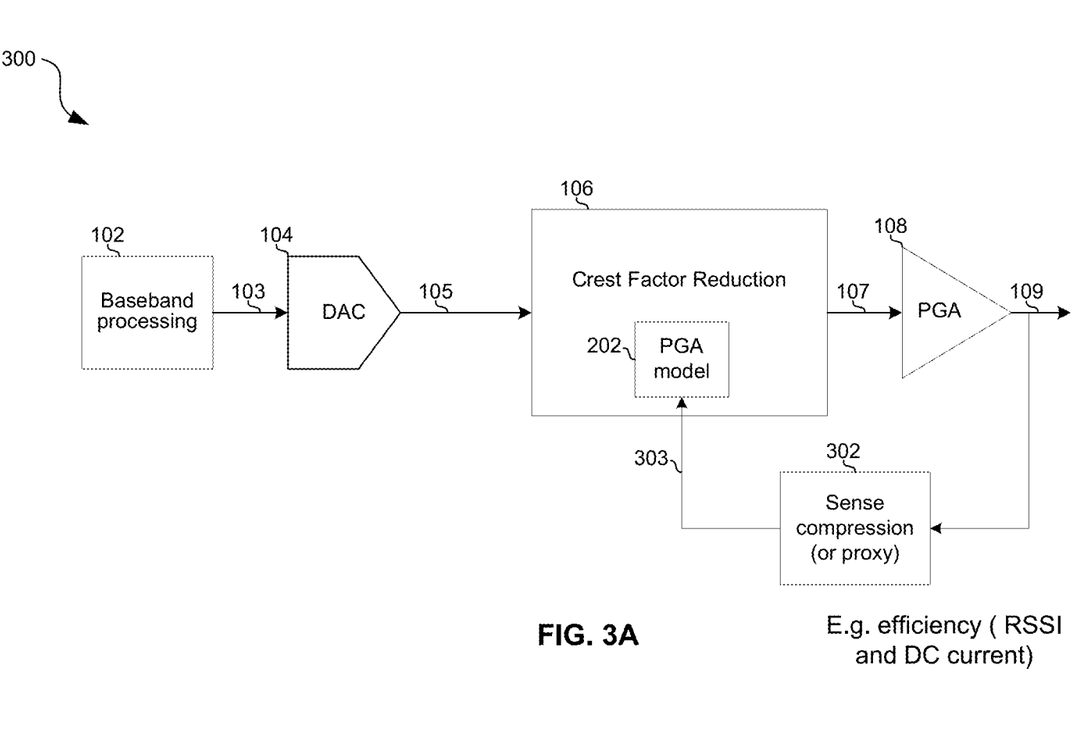
FIG. 3A is a block diagram of a transmitter operable to perform crest factor reduction using a dynamically configured power amplifier model.

FIG. 3A is a block diagram of a transmitter operable to perform crest factor reduction using a dynamically configured power amplifier model. The transmitter 300 is similar to the transmitter 100 of FIG. 1B, but additionally comprises a circuit 302 that may use feedback to dynamically configure the PGA model 202. The behavior of the PGA 108 may change based on the signals being processed, temperature, and/or other factors. Accordingly, to accurately predict the distortion that the amplifier 108 will introduce, the model 202 may be adapted so that it accurately models the PGA 108 under different conditions.

In an example implementation, the circuit 302 may sense/track the 1 dB compression point of the PGA 108 and update the PGA model 202 accordingly. In an example implementation, the compression point may be monitored directly or a proxy for the compression point may be used. For example, efficiency of the PGA 108 may be used as a proxy for the compression point and may be determined by measuring strength, e.g., the received signal strength indication (RSSI) of the signal 109 and DC current drawn by the PGA 108. This measured efficiency may be input top the PGA model 202 to dynamically configure the PGA model 202 and therefore dynamically control the in-band and out-of-band distortion compensation.

Figure 3B:
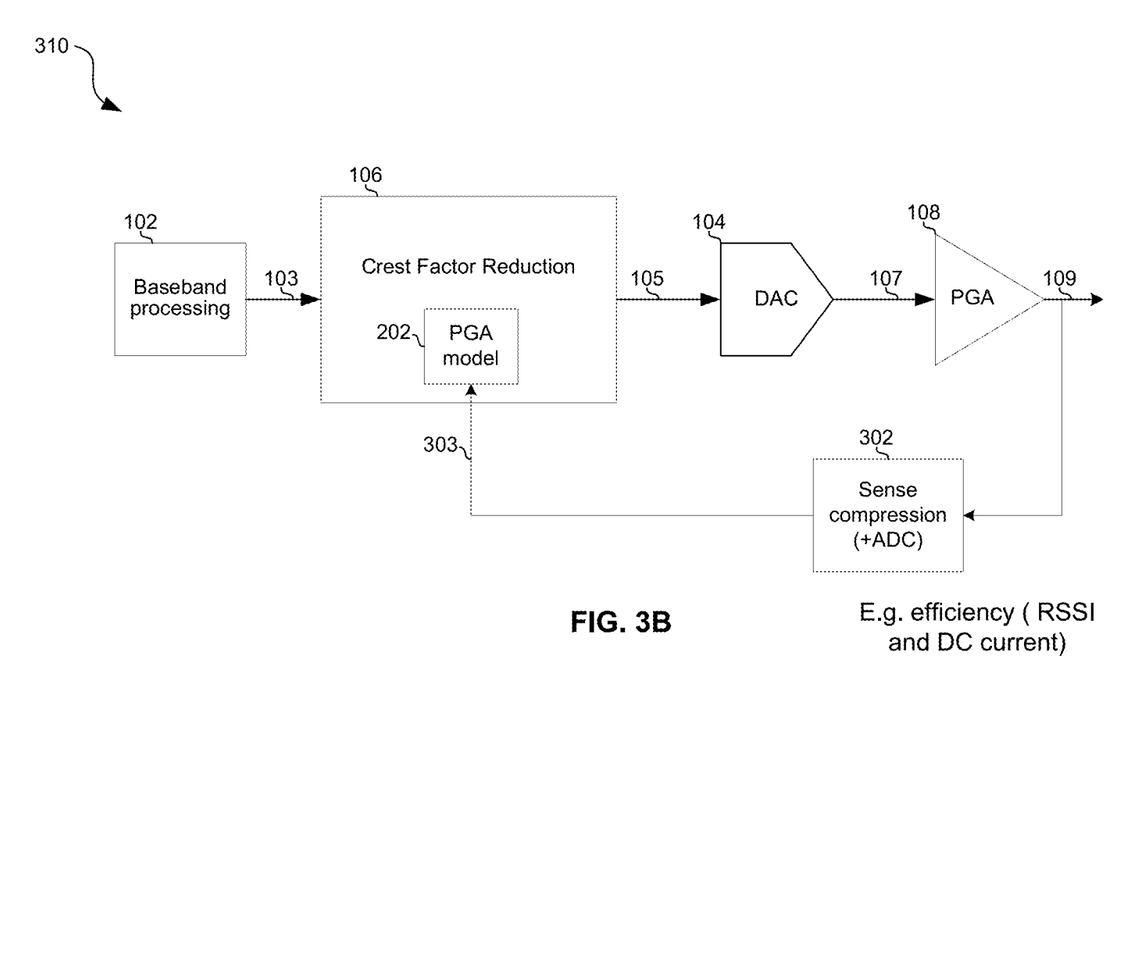
FIG. 3B is a block diagram of another transmitter operable to perform crest factor reduction using a dynamically configured power amplifier model.

FIG. 3B is a block diagram of another transmitter operable to perform crest factor reduction using a dynamically configured power amplifier model. The transmitter 310 is similar to the transmitter 300 but illustrates the CFR module 106 in the digital domain, i.e., prior to the DAC 104. In this manner, digital processing techniques may be utilized to configure the CFR reduction and distortion compensation. In this instance, the circuit 302 may then also comprise an analog-to-digital converter (ADC) to convert the analog signal at the output of the PGA 109 to digital for processing in the digital domain.

As with the transmitter 300, the transmitter 310 may use feedback to dynamically configure the PGA model 202. The behavior of the PGA 108 may change based on the signals being processed, temperature, and/or other factors. Accordingly, to accurately predict the distortion that the amplifier 108 will introduce, the model 202 may be adapted so that it accurately models the PGA 108 under different conditions.

Figure 4A:
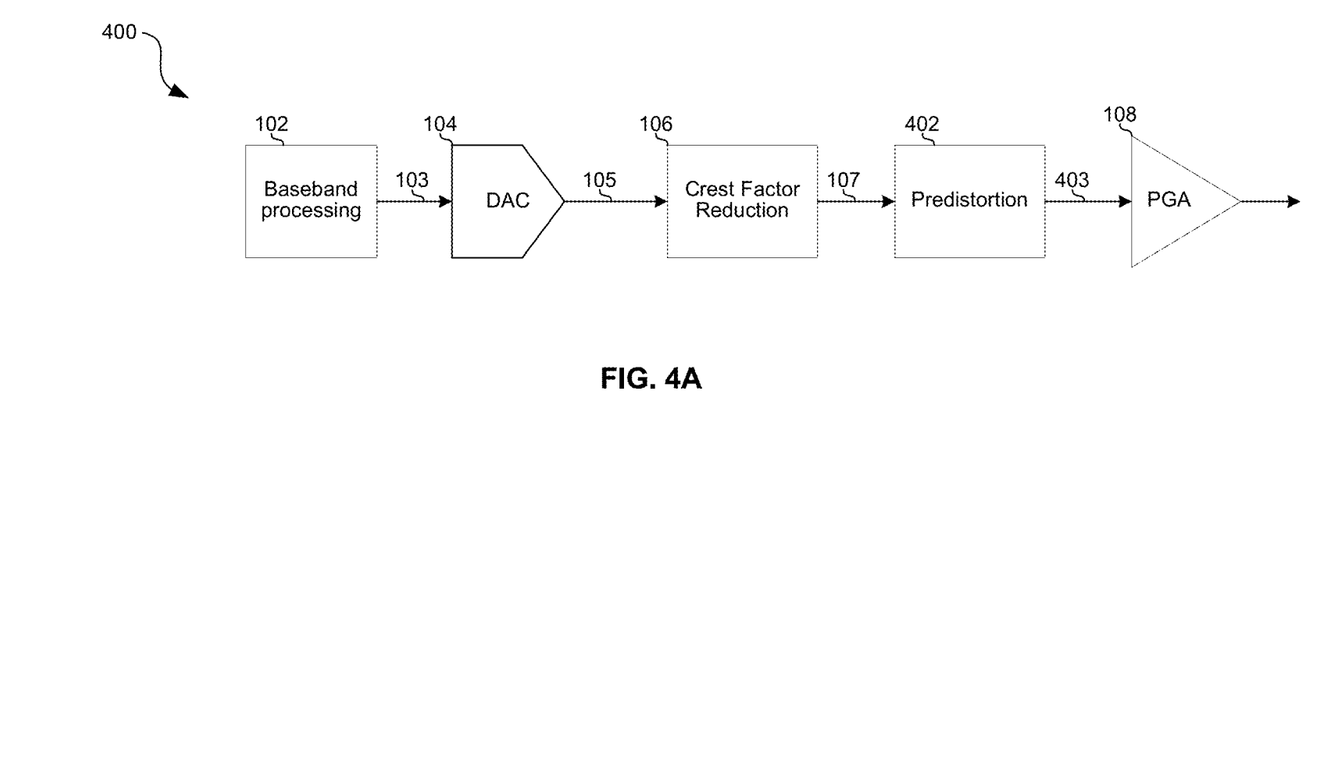
FIGS. 4A and 4B are block diagrams of an example transmitter operable to perform crest factor reduction and predistortion in accordance with aspects of this disclosure.
Figure 4B:
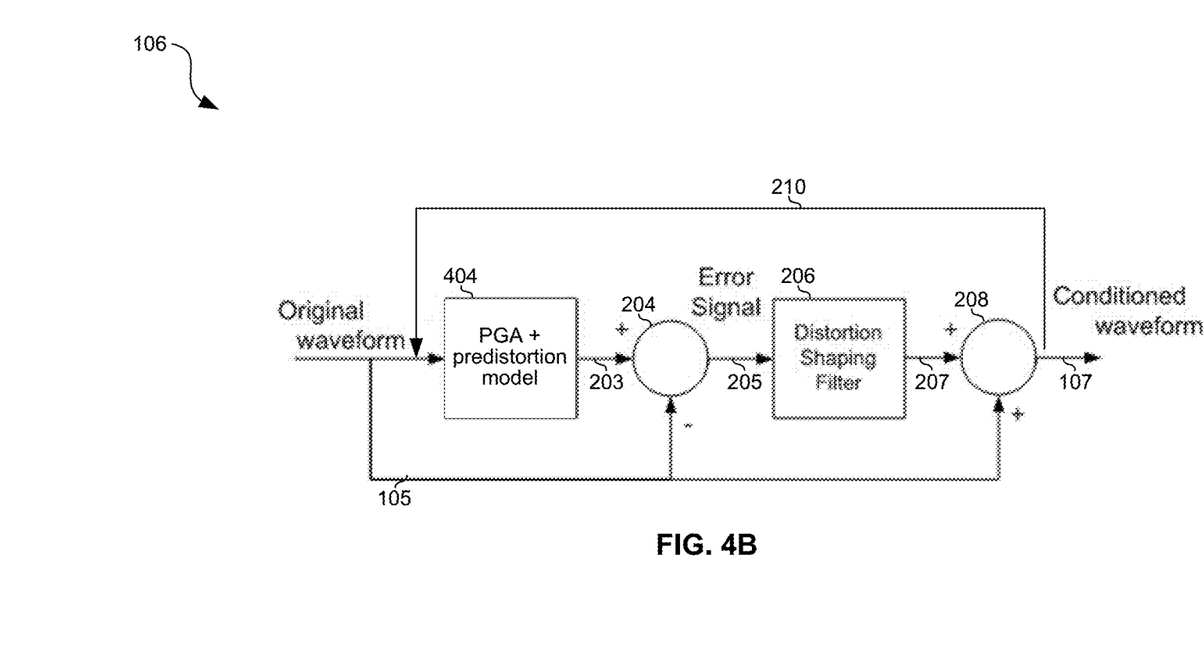

FIGS. 4A and 4B are block diagrams of a transmitter operable to perform crest factor reduction and predistortion in accordance with aspects of the present disclosure. The transmitter 400 is similar to the transmitter 100 of FIG. 1B but additionally comprises a predistortion circuit 402 which may be operable to further compensate for distortion introduced by the PGA 108. In such an example implementation, the PGA model 202 of FIG. 2A may be replaced by a PGA+predistortion model 404, as shown in FIG. 4B, so that the CFR module 106 can account for the presence of the predistortion 402.

In an example implementation, the CFR module 106 may mostly have an impact when the signal levels are relatively high. In such an implementation, the predistortion circuit 402 may be operable to account for such operation of the CFR module 106 by only predistorting signals that are relatively low in amplitude (e.g., below a predetermined threshold). This may enable the CFR module 106 and predistortion circuit 402 to work in harmony to achieve better overall system performance.

As with previous examples, the CFR 106 shown in FIG. 4B may be implemented in the analog domain, the digital domain, or a combination of analog and digital. By incorporating both PGA and predistortion models, higher performance may be achieved in the PGA.

In an embodiment of the disclosure, a method and system for crest factor reduction may comprise generating an original waveform, generating a distortion signal by reducing a crest factor of the original waveform, generating an error signal by subtracting out the original waveform from the distortion signal, generating a conditioned waveform by adding the error signal to the original waveform, and amplifying the conditioned waveform. The crest factor of the original waveform may be reduced based on spectral mask requirements.

The crest factor of the original waveform may be reduced using a limiter. The power amplifier may comprise a programmable gain amplifier (PGA). The distortion signal may be generated based on a PGA model and/or a predistortion model. A signal from an output of the PA may be fed back to the PGA model. The PGA model may be dynamically configured. The crest factor of the original waveform may be reduced in an analog domain and/or a digital domain. The error signal may be filtered utilizing a distortion shaping filter.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for crest factor reduction.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present disclosure may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
   receiving an input signal for amplification by a programmable gain amplifier (PGA);
   generating a distortion signal based on the input signal and a model of the PGA;
   generating an error signal utilizing the input signal and the distortion signal; and
   generating a conditioned waveform with crest factor reduced from that of the input signal utilizing the error signal and the input signal.

2. The method according to claim 1, comprising reducing the crest factor of the input signal based on spectral mask requirements.

3. The method according to claim 1, comprising iterating the generating of the conditioned waveform.

4. The method according to claim 1, comprising generating the distortion signal based on a predistortion model of the PGA.

5. The method according to claim 4, comprising feeding back a signal from an output of the PGA to the predistortion model.

6. The method according to claim 4, comprising dynamically configuring the predistortion model.

7. The method according to claim 1, comprising reducing the crest factor of the input signal in an analog domain.

8. The method according to claim 1, comprising reducing the crest factor of the input signal in a digital domain.

9. The method according to claim 1, comprising filtering the error signal utilizing a distortion shaping filter.

10. A system for communication, the system comprising:
    one or more circuits of a transmitter, said one or more circuits being operable to:
       receive an input signal for amplification by a programmable gain amplifier (PGA);
       generate a distortion signal based on the input signal and a model of the PGA;
       generate an error signal utilizing the input signal and the distortion signal; and
       generate a conditioned waveform with crest factor reduced from that of the input signal utilizing the error signal and the input signal.

11. The system according to claim 10, wherein said one or more circuits are operable to reduce the crest factor of said input signal based on spectral mask requirements.

12. The system according to claim 10, wherein said one or more circuits are operable to iterate the generating of the conditioned waveform.

13. The system according to claim 10, wherein said one or more circuits are operable to generate the distortion signal based on a predistortion model of the PGA.

14. The system according to claim 13, wherein said one or more circuits are operable to feed back a signal from an output of the PGA to the predistortion model.

15. The system according to claim 13, wherein said one or more circuits are operable to dynamically configure the predistortion model.

16. The system according to claim 10, wherein said one or more circuits are operable to reduce the crest factor of the input signal in an analog domain.

17. The system according to claim 10, wherein said one or more circuits are operable to filter the error signal utilizing a distortion shaping filter.

18. A method for communication, the method comprising:
    generating an input signal for amplification by a programmable gain amplifier (PGA);
    generating a distortion signal based on the input signal and a model of the PGA;
    generating an error signal utilizing the input signal and the distortion signal; and
    generating a conditioned waveform with crest factor reduced from that of the input signal utilizing the error signal and the input signal.

19. The method according to claim 18, comprising reducing the crest factor of the input signal based on spectral mask requirements.

20. The method according to claim 18, comprising iterating the generating of the conditioned waveform.

* * * * *